United States Patent
Ollos et al.

(10) Patent No.: US 6,696,999 B2
(45) Date of Patent: Feb. 24, 2004

(54) SIGMA DELTA MODULATOR

(75) Inventors: George Ollos, Bremerton, WA (US); Larry W. Dayhuff, Tucson, AZ (US)

(73) Assignee: Raytheon Company, Waltham, MA (US)

( * ) Notice: Subject to any disclaimer, the term of this patent is extended or adjusted under 35 U.S.C. 154(b) by 0 days.

(21) Appl. No.: 10/196,343

(22) Filed: Jul. 16, 2002

(65) Prior Publication Data

US 2004/0012514 A1 Jan. 22, 2004

(51) Int. Cl.$^7$ ................................................ H03M 3/00
(52) U.S. Cl. ...................... 341/143; 341/156; 341/144; 341/172
(58) Field of Search ................................ 341/143, 156, 341/144, 172, 118, 133

(56) References Cited

U.S. PATENT DOCUMENTS

| | | | | |
|---|---|---|---|---|
| 5,012,244 A | * | 4/1991 | Wellard et al. | 341/143 |
| 5,073,777 A | * | 12/1991 | Fukuhara et al. | 341/143 |
| 5,198,815 A | * | 3/1993 | Przybysz et al. | 341/143 |
| 5,323,156 A | * | 6/1994 | Budmiger | 341/143 |
| 5,327,130 A | * | 7/1994 | Kang et al. | 341/143 |
| 6,437,719 B1 | * | 8/2002 | Noro et al. | 341/143 |

* cited by examiner

Primary Examiner—Michael Tokar
Assistant Examiner—Lam Mai
(74) Attorney, Agent, or Firm—Daly, Crowley & Mofford, LLP

(57) ABSTRACT

A sigma delta modulator having an integrator with a first input for coupling to an analog signal and a second input for coupling to a reference voltage. A comparator is provided having a first input coupled to an output of the integrator and a second input for coupling to the reference voltage. The comparator produces signal having a logic state in accordance with the relative magnitude of signals at the first and second inputs thereof. The logic state is latched at the output of such comparator during latching transitions in a series of latching pulses fed to the comparator. A one-bit quantizer is provided for storing the logic state of at the output of the comparator at sampling transitions of a series of clock pulses fed to the one-bit quantizer. The series of clock pulses and the series of latching pulses are synchronized one with the other. Each one of the latching transitions occurs prior to a corresponding one of the sampling transitions. A buffer is coupled between an output of the quantizer and the first input of the integrator. The regulator produces a voltage to power the buffer. The reference voltage is a fractional portion of the voltage produced by the regulator for the buffer. In one embodiment, the modulator including a second integrator having a first input coupled to the output of the first integrator, a second input for coupling to the reference voltage, and an output coupled to the first input of the comparator. A second buffer is included coupled between an output of the quantizer and the first input of the second integrator.

7 Claims, 2 Drawing Sheets

SIGMA DELTA MODULATOR

TECHNICAL FIELD

This invention relates to sigma delta modulators, and more particularly to high speed, low power sigma delta modulators.

BACKGROUND

As is known in the art, sigma delta modulators have a wide variety of applications, such as in analog to digital converters (ADCs). The modulator operates at a relatively high rate compared to the Nyquist rate in converting an analog input signal into a stream of typically one bit digital signals. In the ADC application, the stream of bits is fed to a decimation filter to produce a series of multi-bit digital words at the converters sampling rate, fs. More particularly, ADC includes a modulator and a decimator. The modulator converts an input voltage into a one-bit data stream at a rate determined by the sampling frequency $Kf_S$. The modulator performs oversampling and noise shaping on the input voltage. The one-bit data stream is provided to decimator which low-pass filters the data stream to reduce the quantization noise component thereof, and provides filtered N-bit output samples at a rate $f_S$. In short, the decimator decimates, by a factor K, the one-bit data stream.

In many applications there is a requirement for very low power, (i.e., less than 5 milli-watts as may be provided by batteries), high resolution (i.e., 16 bit digital words) ADCs.

SUMMARY

A sigma delta modulator is provided having an integrator with a first input for coupling to an analog signal and a second input for coupling to a reference voltage. A comparator is provided having a first input coupled to an output of the integrator and a second input for coupling to the reference voltage. The comparator produces signal having a logic state in accordance with the relative magnitude of signals at the first and second inputs thereof. The logic state is latched at the output of such comparator during latching transitions in a series of latching pulses fed to the comparator. A one-bit quantizer is provided for storing the logic state of the output of the comparator at sampling transitions of a series of clock pulses fed to the one-bit quantizer. The series of clock pulses and the series of latching pulses are synchronized one with the other. Each one of the latching transitions occurs prior to a corresponding one of the sampling transitions.

In one embodiment, a buffer is coupled between an output of the quantizer and the first input of the integrator.

In one embodiment, the modulator includes a voltage regulator. The regulator produces a voltage to power the buffer. The reference voltage is the voltage produced by the regulator for the buffer.

In one embodiment, the modulator including a second integrator having a first input coupled to the output of the first integrator, a second input for coupling to the reference voltage, and an output coupled to the first input of the comparator. A second buffer is included coupled between an output of the quantizer and the first input of the second integrator.

In one embodiment, the first and second buffers are CMOS inverters used to charge the first and second integrators, respectively.

The details of one or more embodiments of the invention are set forth in the accompanying drawings and the description below. Other features, objects, and advantages of the invention will be apparent from the description and drawings, and from the claims.

DESCRIPTION OF DRAWINGS

Like reference symbols in the various drawings indicate like elements.

DETAILED DESCRIPTION

Figure 1:
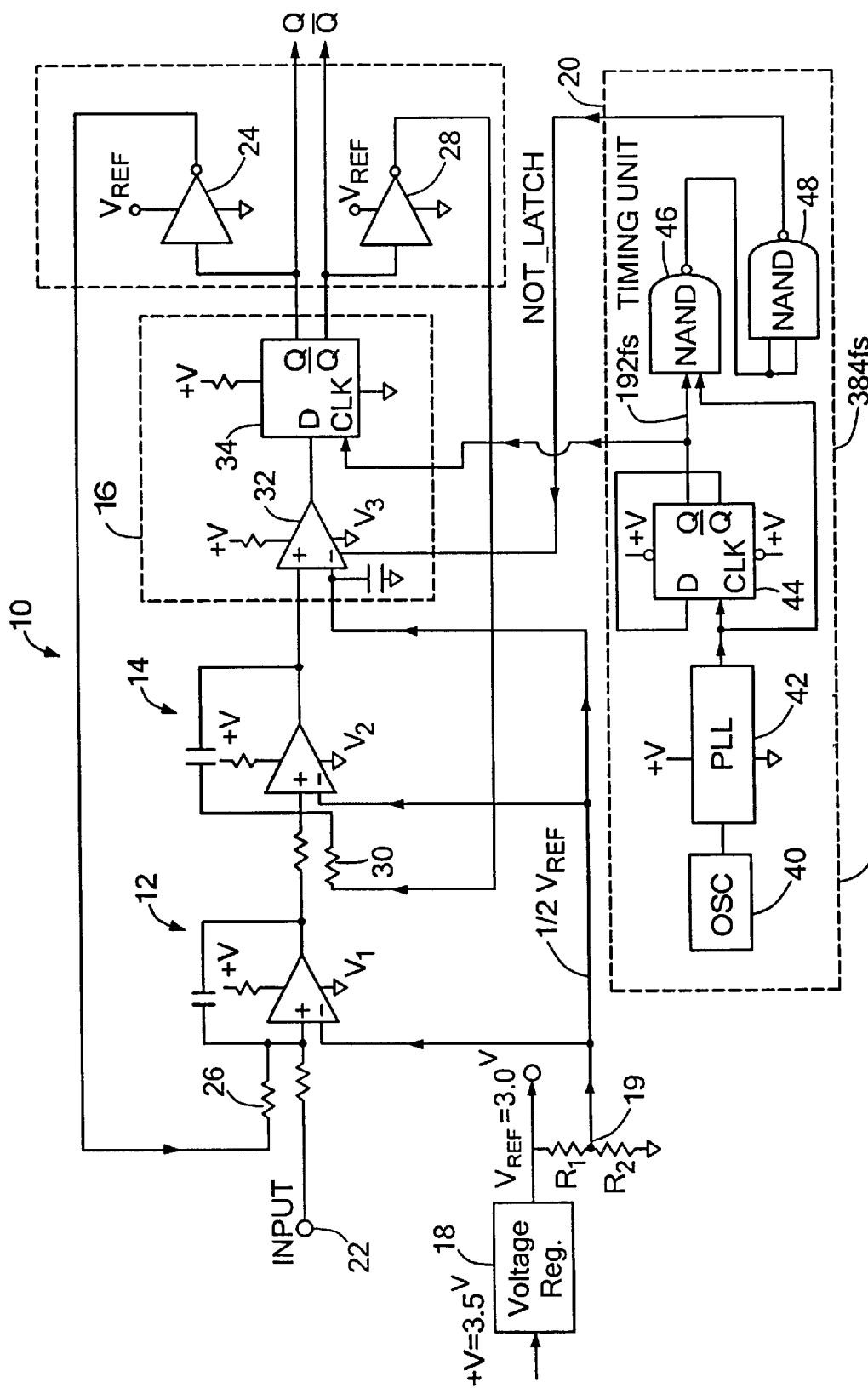
FIG. 1 is a block diagram of a sigma delta modulator in accordance with the invention.

Referring now to FIG. 1, a second-order sigma delta modulator 10 is shown having a pair of integrators 12, 14, a one-bit quantization section 16, a voltage regulator 18 and a timing unit 20. The one-bit quantization section produces a pair of trains of bits at outputs Q and $\overline{Q}$. One of the pair of trains is the compliment of the other one of the pair of trains. One of the trains of bits (i.e., here the train at the Q output) is fedback to a non-inverting input (+) of integrator 12 via an inverting buffer 24 and resistor 26 to be summed with the analog input signal at input terminal 22. The other one of the trains of bits (i.e., here the train at the $\overline{Q}$ output) is fedback to a non-inverting input (+) of integrator 14 via an inverting buffer 28 and resistor 30 to be summed with the output of the integrator 12. The input signal and cancelling current from the one-bit quantizer 34 drive the charge on the integrators 12, 14.

The voltage regulator 18 is fed by a voltage source, here a +V=3.5 volt source and produces a reference voltage $V_{REF}$ here +3.0 volts. The reference voltage $V_{REF}$ is coupled to ground through a pair of serially connected resistors R1 and R2, as shown. Here R1 equals R2 so that a second reference voltage $V_{REF}/2=1.5$ volts is produced at the junction 19 between the resistors R1 and R2. This second reference voltage $V_{REF}/2$ is fed to the inverting (−) inputs of the integrators 12 and 14, as shown.

The quantization unit 16 includes a comparator 32 and a one-bit quantizer 34. The comparator 32 has a first input (non-inverting input (+)) coupled to the output of the second integrator 14 and a second input (inverting (−)) coupled to the second reference voltage $V_{REF}/2$, as shown. The comparator 32 is fed by a signal on line NOT_LATCH produced by the timing unit 20 in a manner to be described in connection with FIG. 2. Suffice it to say here, however, that comparator 32 produces a binary signal having a logic state in accordance with the relative magnitude of signals at the non-inverting (+) and inverting (−) inputs thereof. That is, the comparator 32 quantifies as a logic 1 or logic 0 whether the integrator 12, 14 is above or below the reference zero, here $V_{REF}/2$. Further, the produced logic state is latched at the output of such comparator 32 during latching transitions in a series of latching pulses fed to the comparator on line NOT_LATCH by the timing unit 20 in a manner to be described in more detail in connection with FIG. 2.

The one-bit quantizer 34, here a D-flip/flop, stores the logic state of the output of the comparator 32 at sampling transitions of a series of clock pulses fed to the one-bit quantizer by the timing unit 20 in a manner to be described in connection with FIG. 2. As will be shown in connection with FIG. 2, the series of clock pulses and the series of latching pulses are synchronized one with the other. Further, each one of the latching transitions occurs prior to a corresponding one of the sampling transitions. Thus, the one-bit quantizer 34 is clocked at $192f_S$ from the PLL 42 and provides the negative feedback current to balance the charge injected into the integrators 12, 14 by the input signal.

Referring to FIG. 1, the Q output of the D flip/flop 34 is fedback to the non-inverting input (+) of the first integrator 12 through an inverting buffer 24 and resistor 26, as shown. The $\overline{Q}$ output of the D flip/flop 34 is fedback to the non-inverting input (+) of the second integrator 14 through an inverting buffer 28 and resistor 30, as shown. The rail voltages of the buffers 24 and 28 are $V_{REF}$ and ground.

The timing unit 20 is coupled to an oscillator 40 which produces pulses for a phase lock loop (PLL) 42. The phase lock loop (PLL) 42 produces a train of pulses at a frequency $384f_S$, where $f_S$ is, in an ADC application, the frequency at which the multi-bit digital words are produced by a decimation filter fed by the train of bits at either the output Q or the output $\overline{Q}$ of one-bit quantizer 34. The output train of pulses produced by the PLL 42 is fed as clock pulses to a D-flip/flop 44. The $\overline{Q}$ output of the D flip/flop 44 is fed to the D input thereof, as shown. The Q output of the D-flip/flop 44 thus produces a train of pulses having a frequency $192f_S$ or half the frequency of the pulses produced by the PLL 42. The train of pulses produced by the PLL 42 at the frequency $384f_S$ and the train of pulses produced at the Q output of the D flip/flop 44 are fed as inputs to a NAND gate 46. The output of NAND gate 46 is fed to both inputs of a NAND gate 48 (i.e., now therefore serving as an inverter). The output of NAND gate 48 provides the signal on line NOT_LATCH and the pulses at the Q output of the D-flip/flop 44 provides the clock pulses for the one-bit quantizer 34, as shown in FIG. 1.

Figure 2:
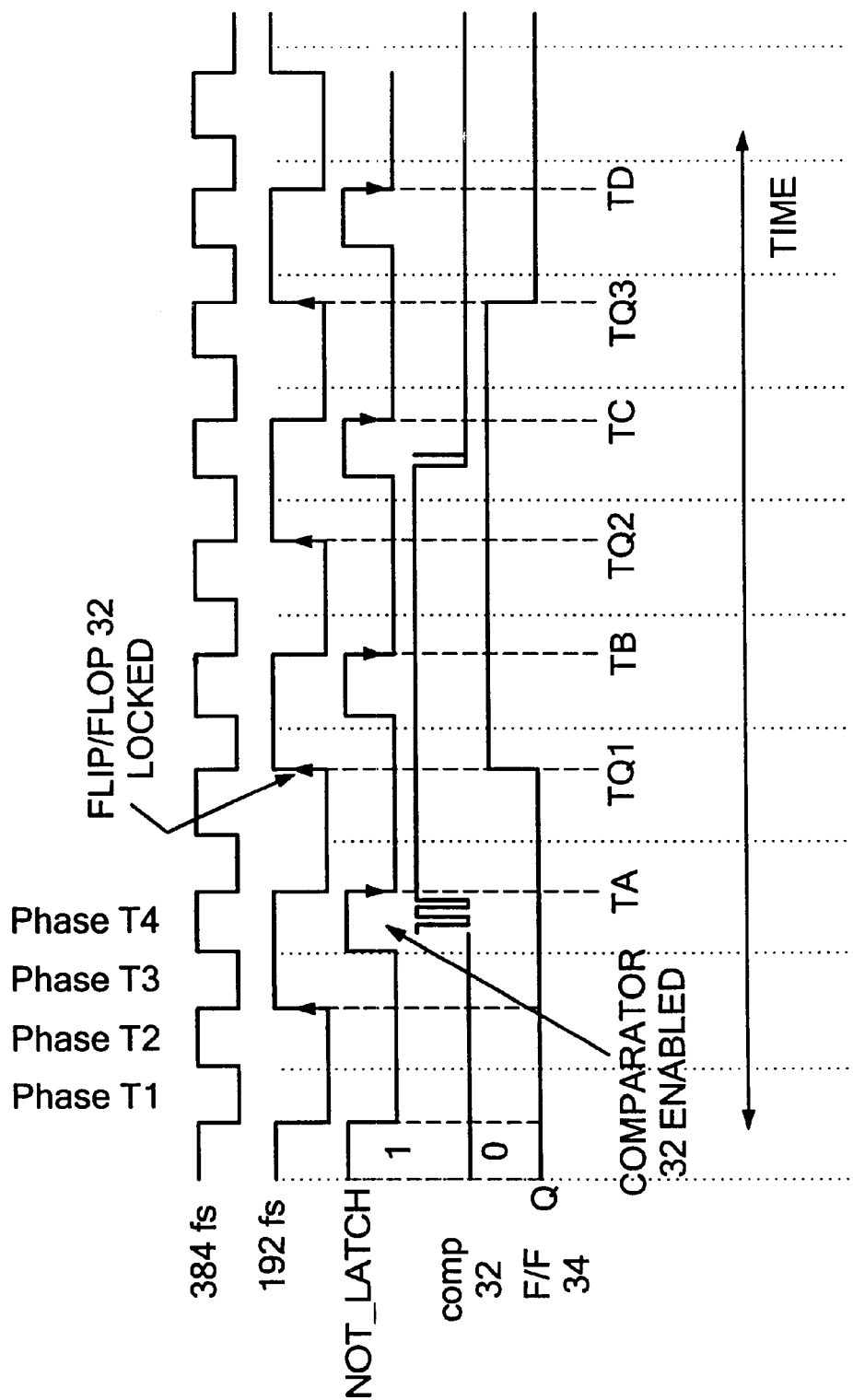
FIG. 2 is a timing diagram useful in understanding the operation of the modulator of FIG. 1.

Referring now to FIG. 2, the top timing diagram shows the train of pulses at the frequency $384f_S$ sproduced at the output of the PLL 42. Note that the train of pulses has four phases, T1, T2, T3 and T4. The second from the top timing diagram shows pulses at the frequency $192f_S$ produced at the Q output of the D flip/flop 44. The next lower diagram shows the signal on the NOT_LATCH line. Note that there is only one pulse for every four phases of the pulses at the frequency $384f_S$ produced at the output of the PLL 42. More particularly, there is one pulse on line NOT_LATCH during the phase T4. During each one of the pulses on line NOT_LATCH the comparator 32 is enabled. However, only the decision of the comparator 32 (FIG. 1) at the falling edge of the pulse on line NOT_LATCH is latched at the output of the comparator 32. Thus, the falling, or trailing edges of the pulses on line NOT_LATCH (i.e., latching transitions of the pulses on line NOT_LATCH) are here at latching transition times TA, TB, TC, TD, . . . It is noted that while the comparator's decision switches between a logic 1 (i.e., "high") and logic 0 ("low") during the phases T4 (i.e., when the comparator 32 is enabled) that the logic level of the comparator 32 is latched at the output of the comparator 32. Thus, the latching transition times TA, TB, TC, TD etc, is that which is latched at the output of the comparator 32. Thus, the comparator 32 produces a binary signal having a logic state in accordance with the relative magnitude of signals at the non-inverting (+) and inverting (−)inputs thereof, but the produced logic state is latched at the output of such comparator 32 during latching transitions TA, TB, TC, TD etc, in a series of latching pulses fed to the comparator on line NOT_LATCH by the timing unit 20.

Thus, in the example shown in FIG. 2, a logic 1 is latched at the output of comparator 32 (shown by the fourth timing diagram from the top in FIG. 2) at latching transition time TA. This latched logic 1 remains at the output of comparator 32 until the next decision phase T4 prior to latching transition time TB. Here, at latching transition time TB the decision of the comparator 32 indicates a logic 1. This latched logic 1 remains at the output of comparator 32 until the next decision phase T4 prior to latching transition time TC. Here, at latching transition time TC the decision of the comparator 32 indicates a logic 0. Thus, at time TC the output of the comparator 32 latches to a logic 0. This latched logic 0 remains at the output of comparator 32 until the next decision phase T4 prior to latching transition time TD. Here, at latching transition time TD the decision of the comparator 32 indicates a logic 0. This latched logic 0 remains at the output of comparator 32 until the next decision phase T4 prior to latching transition time as the process continues.

As noted above in connection with FIG. 2, the pulses produced Q output of the D flip/flop 44 at the frequency $192f_S$ are fed as clock pulses to the one-bit quantizer (here D flip-flop 34). The D flip flop 34 responds to the leading or rising edges of the pulses produced at the Q output of the D flip/flop 44 at the frequency $192f_s$ (shown in the second from the top timing history of FIG. 2). Thus, the D flip/flop 34 responds to clock pulse, or sampling, transitions at times TQ1, TQ2, TQ3, . . . shown in FIG. 2. The Q output of the D flip/flop 34 becomes the logic state of the latched output of the comparator 32 at the sampling transitions times TQ1, TQ2, TQ3, . . . as shown in FIG. 2. Thus, in this example, a logic 1 is produced at the Q output of the D flip/flop 34 at time TQ1, a logic 1 is produced at the Q output of the D flip/flop 34 at time TQ2, a logic 0 is produced at the Q output of the D flip/flop 34 at time TQ3, and the process continues.

Thus, the series of clock pulses and the series of latching pulses are synchronized one with the other. Further, each one of the latching transitions occurs prior to a corresponding one of the sampling transitions. Such an arrangement is a pipelined approach where the state of the comparator 32 is latched and the quantizer is activated or latched.

With the arrangement described, the generation of the feedback signal by buffers 24 and 28 provide the reference signal to the integrators 12 and 14, respectively. This reference signal has the same sensitivity to signal or noise as the input path to the modulator 10. Also, the shape (rise and fall time of this signal) affects the quantity of charge being delivered to the integrators 12, 14. Commercially available CMOS inverters 24, 28 (microgate) are here used to deliver the charge to the integrators 12, 14. The buffers 24, 28 are powered from the reference signal and they provide a clean voltage source to the integrators. They isolate the noisy control logic and provide a symmetrical ON/OFF reference voltage for the feedback.

It is noted that with the arrangement described above, the dynamic range of the modulator 10 is maximized since the input signal approaches the power supply rails. For this reason, the feedback signal current is generated by resistors 26, 30 from the rail-to-rail outputs of the buffers 24, 28. The regulator 18 and the buffers 24, 28 comprise the voltage reference. Any analog or digital clock noise present on this voltage translates to in-band noise. The regulator and buffers provide analog and digital noise isolation. The quantity of the charge delivered to the integrators 12, 14 from the one-bit quantizer 34 is the reference value. Not only is this charge a function of the buffer output voltage, but also of loop timing. To prevent variations in the loop timing, the comparator 32 is also clocked. The comparator 32 is enabled for a controlled period of time and then the result of the comparison is latched in the comparator output. A four-phase clock is generated by timing unit 20 to control both the one-bit quantizer 34 and the comparator 32. The comparator 32 is enabled during phase 4 (i.e., T4) when the latch signal is a one. The result of the comparison is held at the end of phase 4 and clocked into the one-bit quantizer 34 at the beginning of phase 3 (i.e., T3). All of this logic here is implemented in a Field Programmable Gate Array (FPGA). The density of the $192f_S$ bit stream at the output of the one-bit quantizer 34 approximates the input signal. This signal is normally sent to a digital filter (i.e., decimation filter) in an ADC application.

A number of embodiments of the invention have been described. For example, the comparator 32 has an internal latch, the comparator can be latched with a separate latch disposed between the output of such a comparator and the input to the quantizer 34. Nevertheless, it will be understood that various modifications may be made without departing from the spirit and scope of the invention. Accordingly, other embodiments are within the scope of the following claims.

What is claimed is:

1. A sigma delta modulator, comprising:

an integrator having a first input for coupling to an analog signal and a second input for coupling to a reference voltage;

a comparator having a first input coupled to an output of the integrator and a second input for coupling to the reference voltage, such comparator producing signal having a logic state in accordance with the relative magnitude of signals at the first and second inputs thereof, such logic state being latched at the output of such comparator during latching transitions in a series of latching pulses fed to the comparator;

a one-bit quantizer for storing the logic state of at the output of the comparator at sampling transitions of a series of clock pulses fed to the one-bit quantizer; and wherein the series of clock pulses and the series of latching pulses are synchronized one with the other; and wherein each one of the latching transitions occurs prior to a corresponding one of the sampling transitions.

2. The modulator recited in claim 1 including a buffer coupled between an output of the quantizer and the first input of the integrator.

3. The modulator recited in claim 2 including a voltage regulator, such regulator producing a voltage to power the buffer and wherein the reference voltage is a fractional portion of the voltage produced by the regulator for the buffer.

4. The modulator recited in claim 1 including a second integrator having a first input coupled to the output of the first integrator, a second input for coupling to the reference voltage, and an output coupled to the first input of the comparator.

5. The modulator recited in claim 4 including a second buffer coupled between an output of the quantizer and the first input of the second integrator.

6. The modulator recited in claim 5 wherein the voltage regulator produces a voltage to power the second buffer and wherein the reference voltage is the fractional portion of the voltage produced by the regulator for the second buffer.

7. The modulator recited in claim 6 wherein the first and second buffers are CMOS inverters used to charge the first and second integrators, respectively.

* * * * *

UNITED STATES PATENT AND TRADEMARK OFFICE
CERTIFICATE OF CORRECTION

PATENT NO. : 6,696,999 B2
DATED : February 24, 2004
INVENTOR(S) : George Ollos et al.

It is certified that error appears in the above-identified patent and that said Letters Patent is hereby corrected as shown below:

Title page,
Item [57], ABSTRACT,
Line 11, delete "state of at the" and replace with -- state of the --.
Line 14, delete "synchronized one" and replace with -- synchronized, one --.

Column 3,
Line 33, delete "sproduced" and replace with -- produced --.
Line 42, delete "pulses on line" and replace wth -- pulses, on line --.

Column 4,
Line 1, delete "TB the" and replace with -- TB, the --.
Line 5, delete "TC the" and replace with -- TC, the --.
Line 10, delete "TD the" and replace with -- TD, the --.

Column 5,
Line 30, delete "state of at the" and replace with -- state of the --.

Signed and Sealed this

Twenty-first Day of June, 2005

JON W. DUDAS
*Director of the United States Patent and Trademark Office*